United States Patent [19]

Nishizawa et al.

[11] Patent Number: 4,499,654
[45] Date of Patent: Feb. 19, 1985

[54] METHOD FOR FABRICATING SEMICONDUCTOR PHOTODETECTOR

[75] Inventors: Junichi Nishizawa, No. 6-16, Komegafukuro 1-chome, Sendaishi, Miyagi, Japan; Soubei Suzuki; Takashige Tamamushi, both of Miyagi, Japan

[73] Assignee: Kimocjo Nishazawa, Japan

[21] Appl. No.: 561,120

[22] Filed: Dec. 13, 1983

[51] Int. Cl.³ .................. H01L 21/22; H01L 21/265
[52] U.S. Cl. .............................. 29/571; 29/572; 29/578; 148/187
[58] Field of Search ................... 29/571, 572, 578; 148/187

[56] References Cited

U.S. PATENT DOCUMENTS

| 4,377,900 | 3/1983 | Nonaka et al. | 29/571 |
| 4,406,052 | 9/1983 | Cogan | 29/578 X |
| 4,409,725 | 10/1983 | Hotta et al. | 29/571 |
| 4,442,592 | 4/1984 | Kemmer | 29/572 |
| 4,446,175 | 8/1984 | Coe | 148/187 X |

Primary Examiner—G. Ozaki
Attorney, Agent, or Firm—Sughrue, Mion, Zinn, Macpeak, and Seas

[57] ABSTRACT

A method for forming a semiconductor photodetector array having a matrix of pixels, each constituted by a single SIT (Static Induction Transistor). A field oxide layer is formed on a first main surface of a silicon wafer. Portions of a field oxide layer are then removed from predetermined regions of the first main surface. In these predetermined regions are formed a control gate region and a shielding gate region, with the shielding gate region surrounding the control gate region. Oxide layers are formed on the control gate region and shielding gate region. Portions of the field oxide layer between the control gate region and shielding region are removed to partially expose the first main surface of the silicon wafer, and a first main electrode region is formed in the exposed portion. A first conductive electrode is then deposited on the first main region, whereupon the entirety of the first main surface of the silicon wafer is covered with a first insulating layer. Portions of the first insulating layer are then removed from the control gate region, and the entirety of the first main surface of the silicon wafer is covered with a second insulating layer. A second conductive electrode is then formed on the second insulating layer upon the control gate region. Portions of the first and second insulating layers and the oxide on the shielding gate region are removed to provide a contact hole. The first main surface of the silicon wafer is then covered with a metal layer, portions of which are subsequently removed from the control gate region. Finally, an electrode for the second main electrode region is deposited on the second main surface.

4 Claims, 15 Drawing Figures

METHOD FOR FABRICATING SEMICONDUCTOR PHOTODETECTOR

BACKGROUND OF THE INVENTION

The present invention relates to a method for fabricating a semiconductor photodetector. More particularly, the invention relates to a method for fabricating a semiconductor photodetector element composed of a single SIT (Static Induction Transistor) or a plurality of such transistors formed in an array.

The present inventors have developed a semiconductor imaging device which includes pixels constituted each by a single SIT which performs both a photodetecting function and a switching function. Such a device is disclosed in Japanese Patent Applications Nos. 204656/1981 and 157693/1982 filed on Dec. 17, 1981 and Sept. 9, 1982, respectively.

The SIT constituting the semiconductor image device includes an n+ type drain region 3, a p+ type control gate region 4 and a p+ type shielding gate region 5, which are formed in an n− type epitaxial layer 2 formed on an n+ type Si substrate 1 as shown in FIG. 1. The p+ type shielding gate region 5 is formed such that it surrounds the n+ type drain region 3 and the p+ type control gate region 4 and functions to isolate them from adjacent pixels by means of a depletion layer.

The n+ type substrate 1 forms a source region which is common to all of the pixels formed therein. A drain electrode 8 is connected to the n+ type drain region 3 and a source electrode 10 is connected to the source region 1. A control gate electrode 9 is connected through a gate capacitor formed by a gate insulating layer 7 to the control gate region 4.

The SIT pixel formed as described above includes a vertical SIT 20 and a gate capacitor 21 formed between the electrodes 8, 9 and 10 as shown in FIG. 2. The source electrode 10 is grounded, the control gate electrode 9 receives a readout pulse signal $\phi_G$ and the drain electrode 8 is connected through a switch 22, which is turned on upon receipt of a pulse of a video line selection signal $\phi_S$, to a biasing circuit 23 and a readout terminal 24.

When the SIT pixel is irradiated with light under a biased condition, electron-hole pairs are produced around the control gate region 4. Electrons of these pairs flow into the source electrode 10 where they are collected. On the other hand, holes are accumulated in the control gate region 4, which forms a floating electrode of capacitor 21.

The SIT is still in a nonconductive state, even when a large number of holes has been accumulated. When a positive pulse of the gate signal $\phi_G$ is supplied through the gate capacitor 21, the barrier potential of the true gate is lowered, causing a current to flow through the SIT 20, with the magnitude of the current being dependent on the amount of holes accumulated in the control gate region 4, that is, by the amount of light falling on the SIT pixel. The current value is read out at a terminal 24 as a video signal.

In the above described SIT structure, the p+ type shielding gate region 5 functions to separate electrostatically the adjacent pixels from one another. In this case, it may be possible to use the n+ type regions 3 and 1 as the source region and the drain region, respectively.

An imaging device composed of an array of such SITs having a common shielding gate region is much simpler in structure than a conventional imaging device constituted by pixels each having both a diode for photodetection and an MOS transistor for switching because the SIT performs the photodetection function as well as the switching function. Therefore, it becomes possible to substantially increase the integration density of the circuit. Furthermore, an imaging device composed of an array of SITs having a common shielding gate region exhibits a very high photodetectivity and has no switching noise, which is inherent to the MOS device. Although the imaging device disclosed in Japanese Patent Applications Nos. 204656/1982 and 157693/1982 is constituted with a two-dimensional array of SITs having a common shielding gate region, it is possible to form an imaging device with one-dimensionally arranged SITs having a common shielding gate region. It is, of course, possible to use a single SIT as a photoelectric converter. Therefore, it should be noted that, as used herein, the term "photodetector" means inclusively a photoelectric converter constituted by a single SIT and an imaging device constituted by a plurality of SITs arranged in an array with a common shielding gate region.

A photodetector composed of an SIT or multiple SITs performing both a photodetecting function and a switching function has been proposed as a substitute for the conventional MOS type photodetector. However, the development of SIT photodetectors at present is still in the initial stages, and effective methods for fabricating an SIT photodetector have not heretofore been available.

SUMMARY OF THE INVENTION

An object of the present invention is therefore to provide a method for fabricating a photodetector including an SIT or multiple SITs each having a structure as described above. More particularly, an object of the invention is to provide a method for fabricating an SIT photodetector which has desirable photoresponse characteristics and which, when constituted with a plurality of SITs, the variation of photodynamic characteristics among SITs is minimized.

The present invention provides a method for fabricating a vertical type SIT photodetector in which first and second main electrode regions are formed on respective first and second main surfaces of a silicon wafer, and including the following steps:

(i) forming a control gate region having an oxide layer theron and a shielding gate region surrounding the control gate region in predetermined positions on the first main surface on which a field oxide layer is formed, and then forming a first main electrode region in a predetermined position between the gate regions (In the case where the photodetector includes a plurality of the SITs in an array, a plurality of sets each including the control gate region and the first main electrode region are formed according to Step (i), while simultaneously the shielding gate region which is common to the sets is formed on the first main surface.);

(ii) forming an electrode of a first conductive material on the first main electrode region, and then covering the entirety of the first main surface with a first insulating layer;

(iii) removing the first insulating layer on the control gate region and then covering the entirety of the first main surface with a second insulating layer;

(iv) forming an electrode of a second conductive material on the second insulating layer on the control gate region;

(v) removing the second insulating layer, the first insulating layer and the oxide layer from above the shielding gate region to form a contact hole, and then covering the entirety of the first main surface with a metal layer;

(vi) removing the metal layer from at least the area above the control gate region; and (vii) forming an electrode on the second main surface of the second main electrode region.

DESCRIPTION OF THE PREFERRED EMBODIMENTS

FIGS. 3A through 3K are schematic cross-sectional views of an SIT in various manufacturing steps, depicting an embodiment of a method for fabricating a photodetector according to the present invention.

Figure 1:
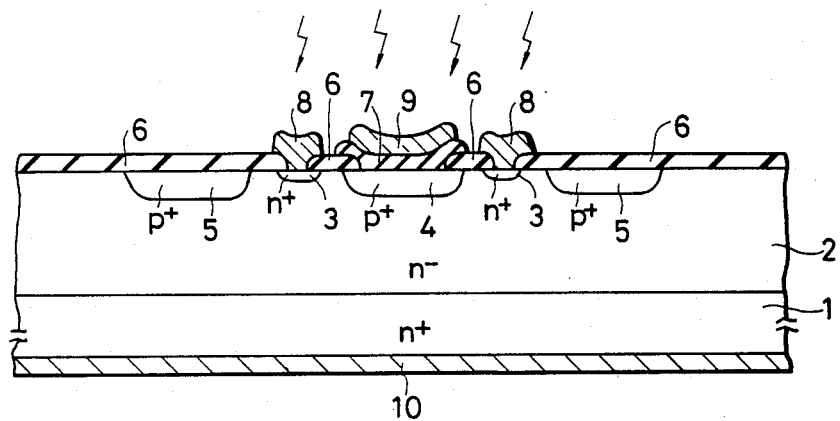
FIG. 1 is a schematic cross-sectional view of an SIT.
Figure 2:
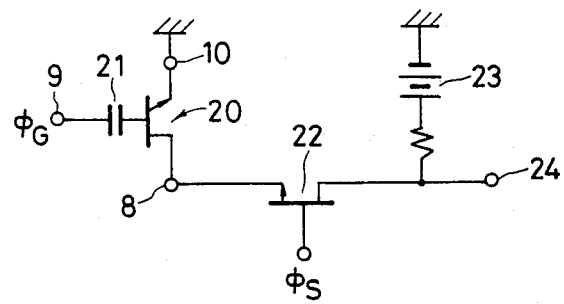
FIG. 2 is a schematic diagram of a circuit used for reading out the SIT.
Figure 3A:
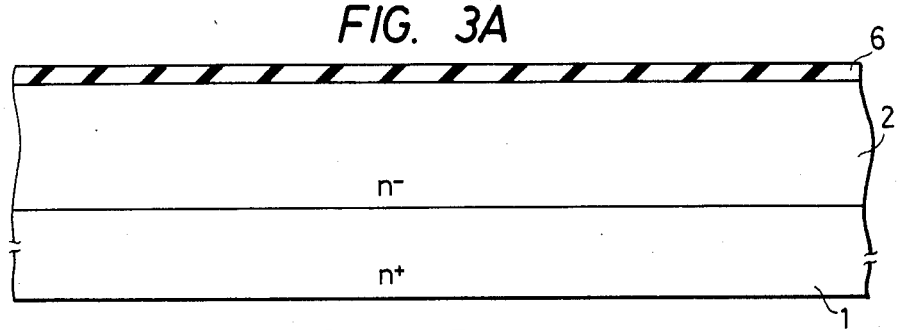
FIGS. 3A through 3K and 4 are schematic cross-sectional views showing various stages of construction of an SIT in accordance with the method of the present invention.

In FIG. 3A, an $n^+$ type (111) Si substrate 1 having an impurity concentration of $10^{18}$ to $10^{20}$ cm$^{-3}$ is prepared. Although Sb or P, etc. may be used as a dopant for forming the $n^+$ type Si substrate 1, it is preferable to use Sb because of its small diffusion coefficient. On the $n^+$ type Si substrate 1, an $n^-$ layer 2, which is 5 to 10 microns thick and has an impurity concentration of $10^{13}$ to $10^{15}$ cm$^{-3}$, is epitaxially grown. The wafer is next subjected to an oxygen atmosphere at 1000 to 1100 degrees C. for 25 to 60 minutes to form a field oxide layer 6 of SiO$_2$ on the $n^-$ type layer 2 to a thickness of 3000 to 8000 Å.

Figure 3B:
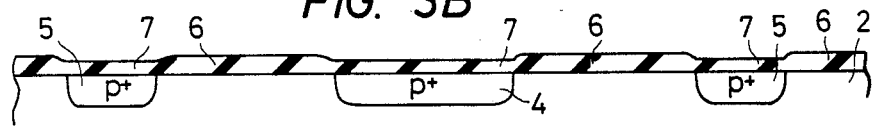

In FIG. 3B, predetermined portions of the field oxide layer 6 where gate regions are to be formed are removed by wet-etching using a masking technique. Then, B (boron) is deposited on those portions through terminal decomposition of BBR$_3$ at about 950 degrees C. Thereafter, by thermally diffusing B in an oxidizing atmosphere of wet O$_2$ at around 1100 degrees C., boron-doped $p^+$ type gate regions 4 and 5, each 2 to 4 microns deep and having impurity concentration of $10^{18}$ to $10^{21}$ cm$^{-3}$, are formed in the $n^-$ layer 2. The gate region 4 is the control gate region and the region 5 is the shielding gate region which surrounds the control gate region 4.

In the case where the image device is to be constituted by a plurality of SITs arranged in an array, a corresponding number of the control gate regions 4 are formed, and the shielding gate region 5 is patterned such that it surrounds commonly the respective control gate regions 4.

The thermal diffusion of B is performed in an oxidizing atmosphere, and therefore an oxide layer 7 is formed on the $p^+$ type gate regions 4 and 5. The $p^+$ type regions 4 and 5 may be formed by ion implantation of B instead of thermal diffusion. In such a case, ion implantation of B may be performed after the field oxide layer 6 on these regions is completely removed, as in the case of the thermal diffusion. Otherwise, the ion implantation may be performed through the field oxide layer 6 after its thickness has been reduced by partial removal. In any case, the oxide layer 7 is formed on the $p^+$ type gate regions 4 and 5.

Figure 3C:
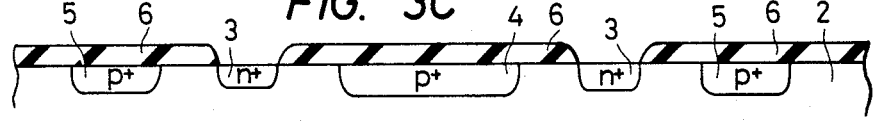

In FIG. 3C, a portion of the field oxide layer 6 in an area between the control gate region 4 and the shielding gate region 5 is completely removed by wet etching using a masking technique. Then, an $n^+$ drain region 3 is formed in the $n^-$ type epitaxial layer 2 thus exposed. The impurity concentration of the $n^+$ type drain region 3 is $10^{19}$ to $10^{21}$ cm$^{-3}$, and the depth thereof is generally 0.1 to 0.5 microns. As or P may be used as a dopant to form the $n^+$ type drain region 3; of these two, As is preferred. The formation of the $n^+$ type drain region 3 by doping may be performed by thermal diffusion or ion implantation in a vacuum or in a closed tube.

Although in FIG. 3A a pair of the $n^+$ type drains 3 is shown as being formed symmetrically with respect to the control gate region 4, each being in an intermediate position between the control gate region 4 and the shielding gate region 5 surrounding the control gate region 4, it should be noted that it is sufficient to provide at least one $n^+$ type drain region 3 between the control gate region 4 and the shielding gate region 5. Also, the position of the drain region 3 in the area between the regions 4 and 5 need not always be precisely at the center thereof.

It may be possible, as disclosed in the aforementioned Japanese Patent Application No. 157693/1982, to improve the photosensitivity of the SIT by forming the drain region 3 in the area between the regions 4 and 5 closer to the shielding gate region 4.

Figure 3D:
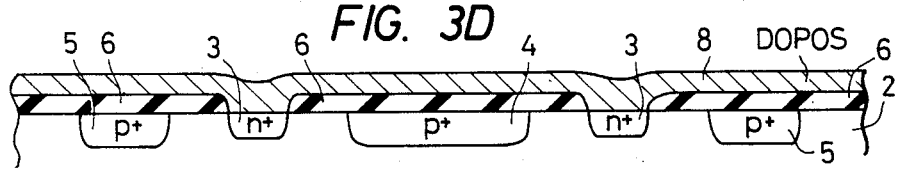

As shown in FIG. 3D, a layer 8 of a first conductive material is next deposited on the entire surface of the wafer. As the first conductive material, polycrystalline Si doped with P (referred to as DOPOS), or a high melting point silicide metal such as molybdenum silicide or SnO$_2$ etc. may be used. DOPOS is most preferred though. The deposition of the DOPOS layer 8 may be performed by CVD using a gaseous mixture of SiH$_4$ and PH$_3$.

Figure 3E:
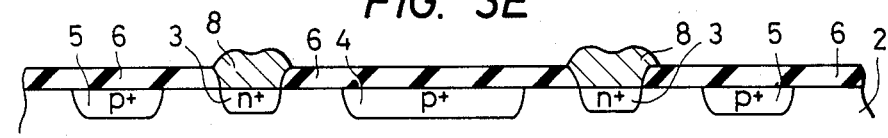

In FIG. 3E, the first conductive material layer 8, except portions thereof on the $n^+$ type drain regions 3, is etched away using a masking technique to thus form drain electrodes on the $n^+$ type drain regions 3. If DOPOS is used as the conductive material, it is preferable to perform the removal of the DOPOS layer 8, except the portion thereof on the $n^+$ type drain regions 3, by plasma etching using CF$_4$, CF$_4$+O$_2$ or PCl$_3$, etc. as an etchant.

Figure 3F:
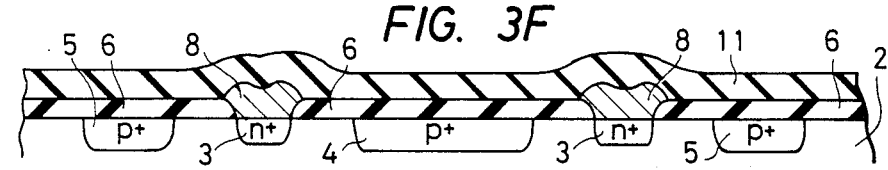

Then, as depicted in FIG. 3F, the entire surface of the wafer is coated with a first insulating material layer 11. The coating of the wafer surface with the first insulating layer 11 is generally performed by CVD of phosphosilicic acid glass (PSG) on the wafer surface using SiH$_4$/O$_2$/PH$_3$ at about 400 degrees C, or SiH$_4$/N$_2$O/PH$_3$ at about 750 degrees C.

Figure 3G:
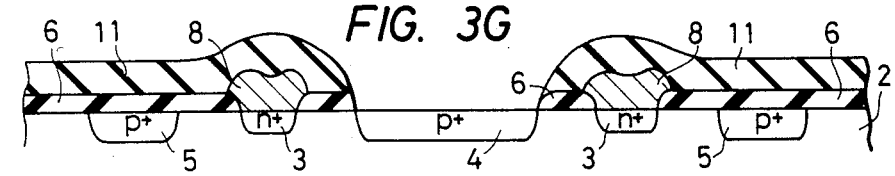

With reference to FIG. 3G, the first insulating layer 11 and the oxide layer 6 on the control gate region 4 are removed by wet etching using a masking technique.

Figure 3H:
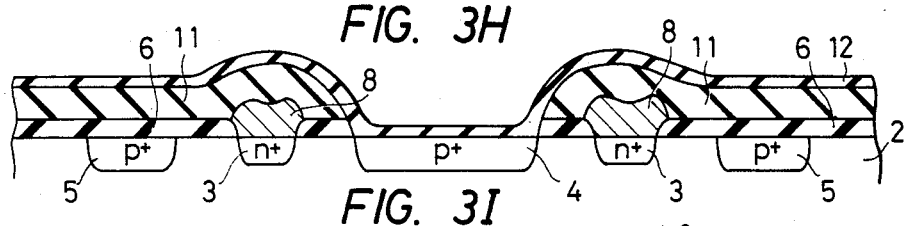

Thereafter, as shown in FIG. 3H, the entire surface is covered by a second insulating layer 12 of a second insulating material. Although any one of Si$_3$N$_4$, SiO$_2$, Al$_2$O$_3$ or AlN$_3$ is usable as the material of the second insulating layer, Si$_3$N$_4$ is preferred since the latter has a high dielectric constant and is capable of forming a good quality layer at a low temperature, as will be described in more detail below. When the insulating layer 12 is made of $Si_3N_4$, it may be formed by CVD using $SiH_4/NH_3$ at 400 to 700 degrees C. to a thickness of 50 to 100 Å.

Figure 3I:
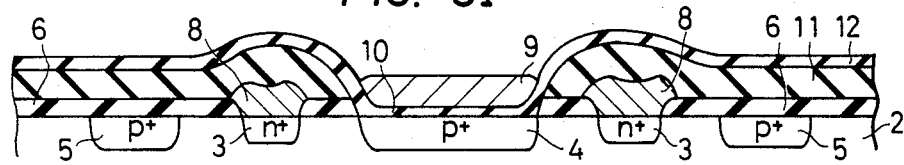

In FIG. 3I, the entire surface of the wafer is covered by a second conductive layer, and then that conductive layer is etched away, except a portion thereof on the control gate region 4, by a masking techique to thus form a control gate electrode 9 on the second insulating layer 12. Thus, a capacitor 10 is formed between the control gate region 4 and the control gate electrode 9 with the second insulating layer 12 forming the dielectric of this capacitor. Since this electrode 9 is formed on the control gate region 4, which is adapted to be used as a light receiving portion, the control gate electrode 12 should be highly transparent. The thickness of the control gate electrode 12 is generally in the range of 2000 to 5000 Å. A conductive material such as Sb-doped $SnO_2$, DOPOS, $In_2O_3$, $Ta_2O_5$ or Al may be used for the control gate electrode 9. Particularly, Sb-doped $SnO_2$ or DOPOS is preferred. If Sb-doped $SnO_2$ is used as the electrode material, a layer of Sb-doped $SnO_2$ is deposited on the entire surface of the wafer by CVD using $SnCl_2/SbCl_5$, and then the $SnO_2$ layer, except a portion thereof on the control gate region 4, is removed by plasma etching with masking. In this case, the etchant is used is preferably $CCl_4$. On the other hand, if DOPOS is used as the conductive material, the DOPOS layer is deposited on the entire surface of the wafer by CVD using $SiH_4/PH_3$, and then the DOPOS layer, except at least a portion thereof on the control gate region 4, is plasma etched using masking. In this case, an etchant such as $CF_4$, $CF_4+O_2$ or $PCl_3$ may be used. When the incident radiation to be sensed is high-energy radition such as an electron beam, aluminum may be used as the control gate electrode material.

Figure 3J:
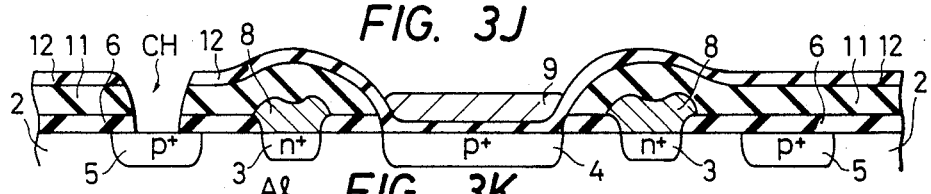

Then, with reference to FIG. 3J, the second insulating layer 12, the first insulating layer 11 and the oxide layer 6 on a portion of the shielding gate region 5 are removed to form a contact hole CH. In detail, after masking the entire surface of the wafer, except an area corresponding to a portion in which a contact hole is to be formed, the second insulating material layer 12 of a material such as $Si_3N_4$ is plasma etched, and then the first insulating material layer 11 of a material such as PSG and the oxide layer 6 are removed by wet etching. It is not always necessary to provide a contact hole for each SIT. The number of the contact holes and the locations thereof can be determined in accordance with the number of SITs constituting the photodetector and the resistance value of the shielding gate region 5.

Figure 3K:
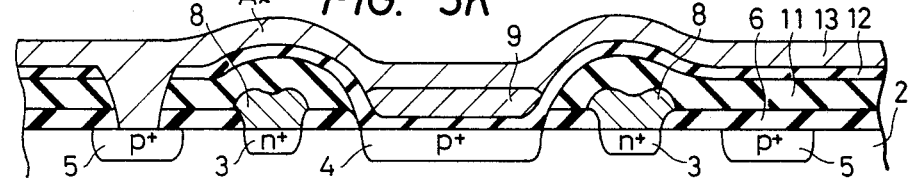

In FIG. 3K the entire surface of the wafer is coated with a metal layer 13 about 1.0 microns thick. The metal layer 13 is formed by depositing aluminum containing 0 to 10% Si on the surface of the wafer using electron beam deposition or sputtering.

Figure 4:
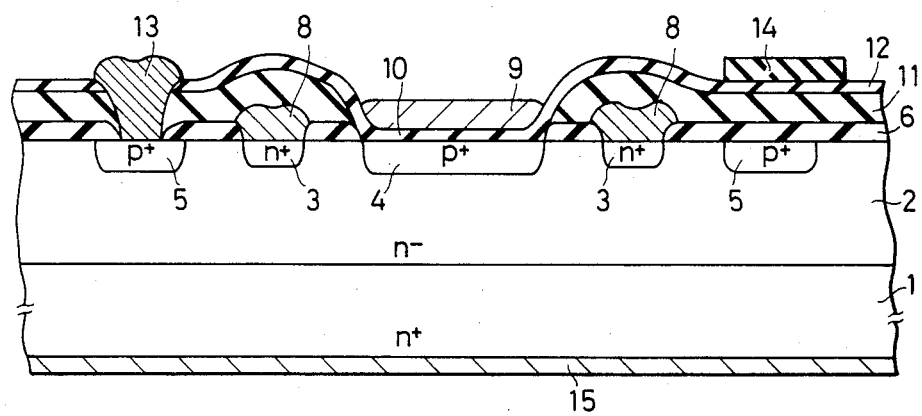

Thereafter, at least a portion of the metal layer 13 on the control gate region is removed, and then an aluminum, for example, electrode 15 is formed on the entirety of the rear side surface of the wafer, that is, the surface of the n+ type Si substrate 1 (n+ type source region) as shown in FIG. 4. The wafer thus prepared is annealed in a vacuum, an inert gas or hydrogen at 400 to 450 degrees C.

In the SIT thus fabricated, an example of which is shown in FIG. 4, although the metal layer 13 is removed, except the portion thereof filling the contact hole CH and a portion which constitutes a light shielding layer 14 continuous with the shield gate electrode 13 and which functions to shield the right-side shielding gate region 5 from light, it is possible to remove only the metal layer portion on the control gate region 4 which is used as the light receiving portion of the photodetector.

According to the present method of fabricating a photodetector, it becomes possible to produce a photodetector constituted by one or more SITs which exhibits a superior photoresponse characteristics. Furthermore, according to the present invention, it becomes possible to produce a photodector composed of a plurality of SITs with variations among the photodynamic characteristics of the respective SITs minimized.

Figure 5:
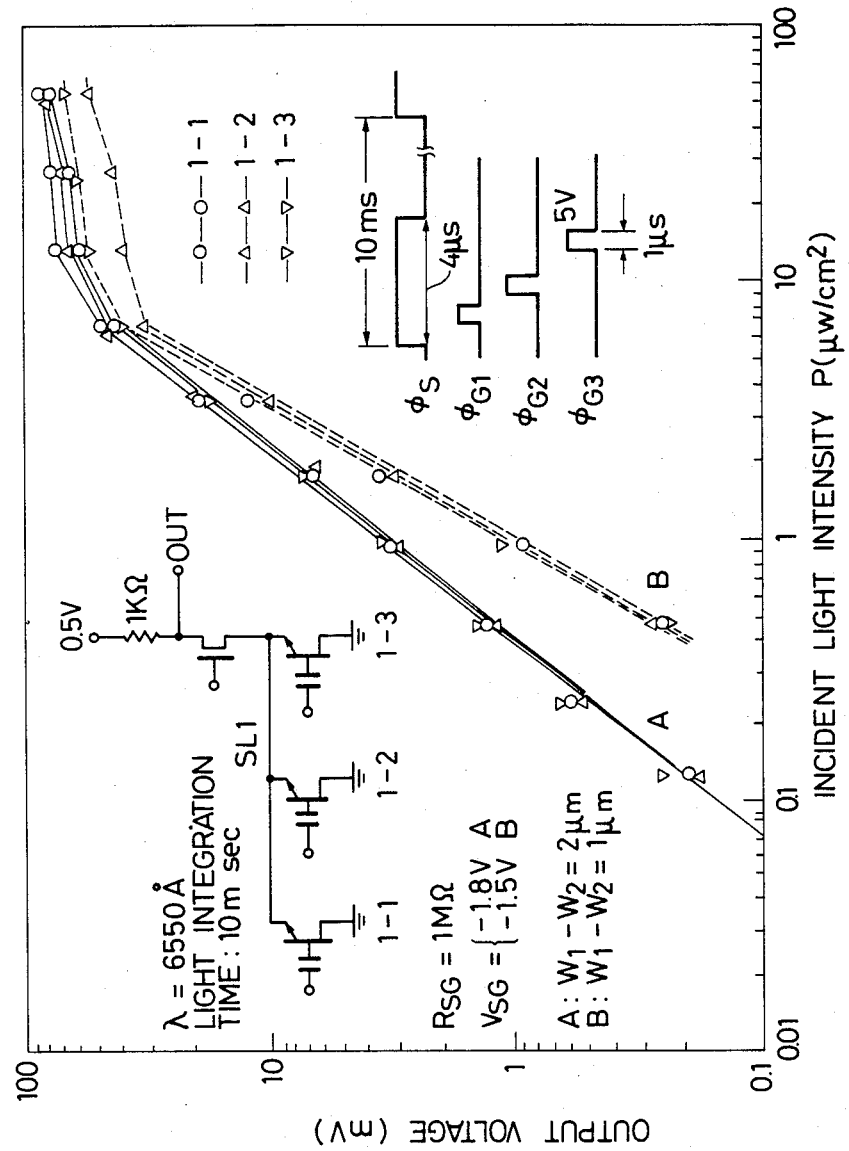
FIG. 5 is a graph showing the photodynamic characteristics of an SIT photodetector fabricated according to the method of the present invention.

FIG. 5 is a graph showing the photodynamic characteristics of a photodector fabricated according to the method of the present invention. The photodynamic characteristic data plotted in FIG. 5 was obtained from three SITs of a photodetector composed of a 4×4 matrix of SITs, each having the same cross-sectional structure as shown in FIG. 4 except for the drain region 3 being located closer to the shielding gate region 5. The structure of each of the SITs includes the n− type epitaxial layer 2 having an impurity concentration of $10^{13}$ $cm^{-3}$ and a depth of 8 to 10 microns, and the p+ type control gate region 4 and the p+ type shielding gate region 5 having an impurity concentration of $10 cm^{-3}$ or more and a depth of 2 to 4 microns. The size of each SIT was on the order of 100 microns×100 microns.

In FIG. 5, a group A of curves corresponds to the photodynamic characteristics observed for a chip (chip A) having 16 SITs arranged in a 4×4 matrix wherein $W_1-W_2=2.0$ microns, and a group B of curves corresponds to the photodynamic characteristics observed for a chip (chip B) having a 4×4 matrix of SITs wherein $W_1-W_2=1.0$ microns, where $W_1$ is the distance between the control gate region and the drain region.

Reverse biasing voltages applied through a bias resistor $R_{SG}$ (1 megohm) to the electrically common shielding gate region of the chip A and through a resistor of the same value to that of the chip B are −1.8 V and −1.5 V, respectively. The photodynamic characteristics shown in FIG. 5 correspond to the case where the light integration time is 10 msec, and upon applications of readout pulses of the signal $\phi_G$, each having an amplitude of 5 V and width of 1 sec thereto, video information is readout sequentially.

As shown in FIG. 5, the SITs constituting the chip A and the SITs constituting the chip B have a high photo sensitivity (high output voltage). The SITs constituting the chip A, wherein $W_1-W_2=2$ microns, are more sensitive to very weak light than the SITs constituting the chip B, wherein $W_1-W_2=1$ microns.

It has been found that the photoyanmic range of the photodetector is 40 dB or more, and that, the S/N ratio is also 40 dB or more. Thus the SIT photodetector fabricated according to the method of the present invention exhibits superior photoresponse characteristics. Furthermore, as is clear from FIG. 5, the variations among the photodynamic characteristics of the respective SITs constituting the chip A and of those constituting the chip B are very small. That is, according to the present invention, there is a photodetector constituted by a plurality of SITS whose photodynamic characteristics variations are very small.

We claim:

1. A method for fabricating a photodetector comprising at least one vertical-type induction transistor, comprising the steps of:
   a. forming a field oxide layer on a first main surface of a silicon wafer;
   b. forming a control gate region and a shielding gate region in said predetermined regions of said first main surface, said control gate region being surrounded by said shielding gate region, and said control gate region and said shielding gate region having oxide layers formed thereon;
   c. removing at least a portion of said field oxide layer in a region between said control gate region and said shielding gate region to partially expose said first main surface of said silicon wafer;
   d. forming a first main electrode region in the exposed portion of said first main surface of said silicon wafer;
   e. forming an electrode of a first conductive material on said first main electrode region;
   f. covering the entirety of said first main surface of said silicon wafer with a first insulating layer;
   g. removing portions of said first insulating layer from said control gate region;
   h. covering the entirety of said first main surface of said silicon wafer with a second insulating layer;
   i. forming an electrode of a second conductive material on said second insulating layer on said control gate region;
   j. removing portions of said second insulating layer, said first insulating layer and said oxide layer on said shielding gate region to form a contact hole;
   k. covering the entirety of said first main surface of said silicon wafer with a metal layer;
   l. removing at least a portion of said metal layer on said control gate region; and
   m. forming an electrode for a second main electrode region on a second main surface of said silicon wafer.

2. The method as claimed in claim 1, wherein, in said step c, a plurality of said control gate regions are formed in an array and said shielding gate region is formed surrounding said gate regions.

3. The method as claimed in claim 2, wherein said array of said control gate regions is one dimensional.

4. The method as claimed in claim 2, wherein said array of said control gate regions is two dimensional.

* * * * *

UNITED STATES PATENT AND TRADEMARK OFFICE
CERTIFICATE OF CORRECTION

PATENT NO.    :    4,499,654
DATED         :    February 19, 1985
INVENTOR(S)   :    Nishizawa et al It is certified that error appears in the above-identified patent and that said Letters Patent is hereby corrected as shown below:

On the front page at "[73] Assignee:" please change "Kimocjo Nishazawa, Japan" to -- Junichi Nishizawa, Japan --.

Signed and Sealed this

Twenty-sixth Day of November 1985

[SEAL]

Attest:

DONALD J. QUIGG

Attesting Officer

Commissioner of Patents and Trademarks